(12) United States Patent
Simmons et al.

(10) Patent No.: US 10,060,950 B2
(45) Date of Patent: Aug. 28, 2018

(54) SHIELDED PROBE SYSTEMS

(71) Applicant: Cascade Microtech, Inc., Beaverton, OR (US)

(72) Inventors: Michael E Simmons, Colton, OR (US); Bryan Conrad Bolt, Beaverton, OR (US); Christopher Anthony Storm, Hillsboro, OR (US); Kazuki Negishi, Beaverton, OR (US); Joseph George Frankel, Beaverton, OR (US); Robbie Ingram-Goble, Portland, OR (US)

(73) Assignee: FormFactor Beaverton, Inc., Beaverton, OR (US)

( * ) Notice: Subject to any disclaimer, the term of this patent is extended or adjusted under 35 U.S.C. 154(b) by 247 days.

(21) Appl. No.: 14/997,345

(22) Filed: Jan. 15, 2016

(65) Prior Publication Data

US 2017/0205446 A1 Jul. 20, 2017

(51) Int. Cl.
*G01R 31/00* (2006.01)
*G01R 1/18* (2006.01)
*G01R 1/067* (2006.01)
*G01R 31/28* (2006.01)

(52) U.S. Cl.
CPC .......... *G01R 1/18* (2013.01); *G01R 1/06705* (2013.01); *G01R 31/2849* (2013.01)

(58) Field of Classification Search
CPC ........ G01R 1/416; G01R 1/466; G01R 1/675; G01R 1/18; G01R 31/2886

See application file for complete search history.

(56) References Cited

U.S. PATENT DOCUMENTS

| | | | | |
|---|---|---|---|---|
| 4,636,722 A | * | 1/1987 | Ardezzone | G01R 1/07342 324/750.14 |
| 5,240,555 A | * | 8/1993 | Kilburn | H01L 21/31116 134/1 |
| 5,835,997 A | * | 11/1998 | Yassine | G01R 1/18 324/750.14 |
| 7,043,848 B2 | * | 5/2006 | Hollman | G01R 31/2891 33/286 |
| 7,190,182 B2 | | 3/2007 | Romanov | |
| 7,235,990 B1 | | 6/2007 | Kreissig et al. | |
| 7,460,983 B2 | | 12/2008 | Pickerd et al. | |

(Continued)

*Primary Examiner* — Tung X Nguyen
*Assistant Examiner* — Dominic Hawkins
(74) *Attorney, Agent, or Firm* — Dascenzo Intellectual Property Law, P.C.

(57) ABSTRACT

Shielded probe systems are disclosed herein. The probe systems are configured to test a device under test (DUT) and include a measurement chamber that at least partially bounds an enclosed volume, an aperture defined by the measurement chamber, a probing assembly, and a shielding structure. The probing assembly includes a probe, which is oriented within the enclosed volume, a probe arm, which is operatively attached to the probe, and a manipulator, which is operatively attached to the probe arm. At least a portion of the probing assembly extends through the aperture. The shielding structure extends between the measurement chamber and the probing assembly and is configured to restrict fluid flow through the aperture and shield the enclosed volume from an ambient environment that surrounds the measurement chamber while maintaining at least a threshold separation distance from the probe arm throughout a probe arm range-of-motion thereof.

22 Claims, 3 Drawing Sheets

(56) References Cited

U.S. PATENT DOCUMENTS

| | | | |
|---|---|---|---|
| 7,796,376 B2 | 9/2010 | Cairo et al. | |
| 8,071,892 B2 * | 12/2011 | Leegate | H05K 9/0018 |
| | | | 174/380 |
| 8,351,220 B2 | 1/2013 | Liang et al. | |
| 2003/0042921 A1 * | 3/2003 | Hollman | G01R 1/07392 |
| | | | 324/750.14 |
| 2008/0204058 A1 * | 8/2008 | Gunji | G01R 1/06705 |
| | | | 324/755.01 |
| 2015/0352669 A1 * | 12/2015 | Kondo | H01L 21/67115 |
| | | | 438/7 |

* cited by examiner

SHIELDED PROBE SYSTEMS

FIELD OF THE DISCLOSURE

The present disclosure relates generally to shielded probe systems and more specifically to shielded probe systems that utilize a shielding structure to shield an aperture of a measurement chamber of the probe system from an ambient environment that surrounds the probe system.

BACKGROUND OF THE DISCLOSURE

Probe systems may be utilized to test operation and/or performance of a device under test (DUT). Probe systems generally include one or more probes that may be configured to provide a test signal to the DUT and/or to receive a resultant signal from the DUT. By measuring the response of the DUT to the test signal (e.g., by measuring and/or quantifying the resultant signal), the operation and/or performance of the DUT may be quantified.

Under certain circumstances, it may be desirable to test the DUT under controlled environmental conditions. As examples, it may be desirable to test the DUT under controlled thermal conditions, under controlled light conditions, and/or under controlled atmospheric conditions, such as to quantify operation and/or performance of the DUT under these controlled environmental conditions. Additionally or alternatively, it also may be desirable to test the DUT under low noise conditions, such as by limiting electromagnetic interference (EMI) with the testing process and/or by limiting electromagnetic radiation and/or electric fields within the testing environment.

Traditionally, probe systems have utilized enclosures to control and/or regulate the test environment. Some enclosures are configured to house and/or contain the DUT, the one or more probes, and one or more manipulators that may be utilized to position the probes relative to the DUT. While such enclosures may be effective, they also may be inconvenient, as such enclosures must be opened to permit adjustment of the position of the probes via actuation of the manipulators.

Other enclosures are configured to retain the one or more manipulators external to the enclosure. Such enclosures may permit adjustment of the position of the probes, via actuation of the manipulators, without opening the enclosure. However, such enclosures must include an aperture that permits a mechanical linkage, which supports the probe, to extend from the manipulator and into the enclosure. This aperture may limit the effectiveness of the enclosure at controlling environmental conditions therein. Traditional structures that have been utilized to seal, or at least partially seal, this aperture also may reduce the positioning accuracy of the probe, such as via contact between the traditional structures and the probe. Thus, there exists a need for improved shielded probe systems.

SUMMARY OF THE DISCLOSURE

Shielded probe systems are disclosed herein. The probe systems are configured to test a device under test (DUT) and include a measurement chamber that defines an enclosed volume. The enclosed volume is configured to receive the DUT. The probe systems also include an aperture that is defined by the measurement chamber and opens into the enclosed volume.

The probe systems further include a probing assembly. The probing assembly includes a probe, which is oriented within the enclosed volume. The probing assembly also includes a probe arm that has a DUT-distal end and a DUT-proximal end. The DUT-proximal end of the probe arm is operatively attached to the probe. The probing assembly further includes a manipulator that is operatively attached to the DUT-distal end of the probe arm. The manipulator is external to the enclosed volume and is configured operatively translate the probe arm throughout a probe arm range-of-motion to operatively translate the probe relative to the DUT. At least a portion of the probing assembly extends through the aperture.

The probe systems further include a shielding structure. The shielding structure extends between the measurement chamber and the probing assembly and is configured to restrict fluid flow through the aperture and to shield the enclosed volume from an ambient environment that surrounds the measurement chamber. The shielding structure further is configured to maintain at least a threshold separation distance from the probe arm when the probe arm is moved throughout the probe arm range-of-motion.

DETAILED DESCRIPTION AND BEST MODE OF THE DISCLOSURE

FIGS. 1-7 provide examples of probe systems 20 and/or of shielding structures 200 according to the present disclosure. Elements that serve a similar, or at least substantially similar, purpose are labeled with like numbers in each of FIGS. 1-7, and these elements may not be discussed in detail herein with reference to each of FIGS. 1-7. Similarly, all elements may not be labeled in each of FIGS. 1-7, but reference numerals associated therewith may be utilized herein for consistency. Elements, components, and/or features that are discussed herein with reference to one or more of FIGS. 1-7 may be included in and/or utilized with any of FIGS. 1-7 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

Figure 1:
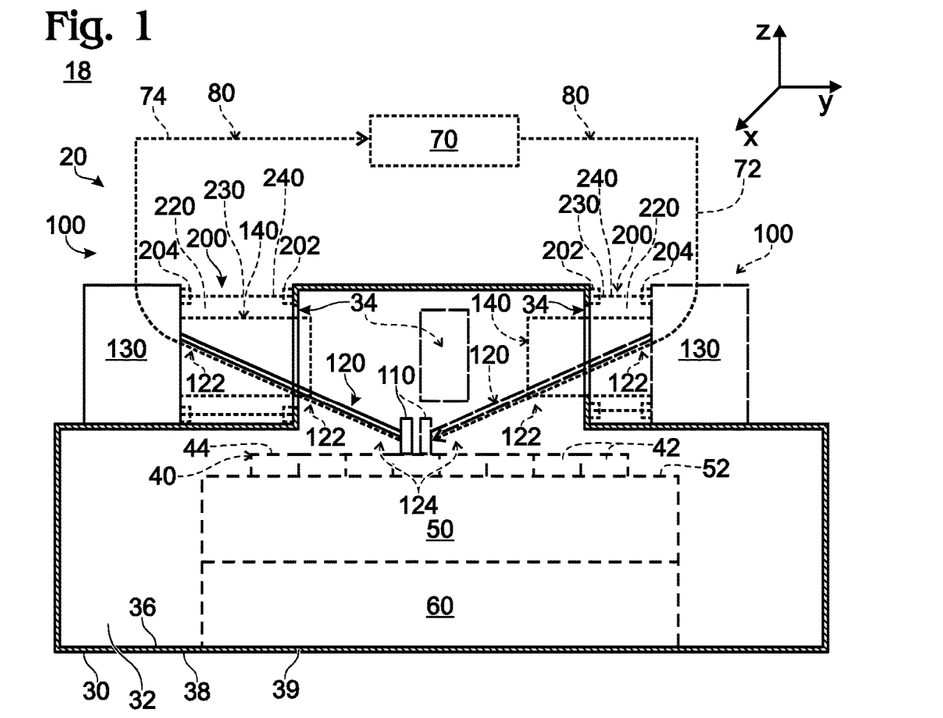
FIG. 1 is a schematic representation of shielded probe systems according to the present disclosure.

FIG. 1 is a schematic representation of shielded probe systems 20 according to the present disclosure, while FIGS. 2-7 provide less schematic cross-sectional views of a portion of shielded probe systems 20, according to the present disclosure, that could include and/or be shielded probe system 20 of FIG. 1. Shielded probe system 20 also may be referred to herein as a probe system 20, a test system 20, and/or a system 20. Probe systems 20 may be adapted, configured, designed, and/or constructed to test one or more devices under test (DUT) 42, which may be formed on, supported by, and/or included in a substrate 40.

As illustrated in solid lines in FIGS. 1-7, probe systems 20 include a measurement chamber 30 that at least partially bounds, or defines, an enclosed volume 32. Enclosed volume 32 may be adapted, configured, designed, and/or constructed to receive substrate 40 and/or DUT 42. As also illustrated in solid lines, probe systems 20 further include an aperture 34. Aperture 34 may be defined by measurement chamber 30, may open into enclosed volume 32, and/or may provide access into enclosed volume 32 from external the measurement chamber.

Probe systems 20 further include a probing assembly 100. As illustrated in dashed lines in FIG. 1, probing assembly 100 may be adapted, configured, designed, and/or constructed to convey one or more test signals 72 from a signal generation and analysis assembly 70 to DUT 42 and/or to receive one or more resultant signals 74 from the DUT.

Returning to FIGS. 1-7, probing assembly 100 includes a probe 110, a probe arm 120, and a manipulator 130. Probe 110 may be oriented within enclosed volume 32. Probe arm 120 may include a DUT-distal end 122 and a DUT-proximal end 124. DUT-proximal end 124 may be proximal DUT 42 relative to DUT-distal end 122. Similarly, DUT-distal end 122 may be distal DUT 42 relative to DUT-proximal end 124. Stated another way, a distance between DUT-proximal end 124 and DUT 42 may be less than a distance between DUT-distal end 122 and DUT 42. Similarly, the distance between DUT-distal end 122 and DUT 42 may be greater than the distance between DUT-proximal end 124 and DUT 42.

DUT-proximal end 124 may be operatively attached to probe 110. Manipulator 130 may be operatively attached to DUT-distal end 124, and manipulator 130 is external to enclosed volume 32. In addition, and as illustrated, at least a portion of probing assembly 100 may extend through and/or within aperture 34.

Probe system 20 further includes a shielding structure 200. Shielding structure 200 extends between measurement chamber 30, or at least a portion of measurement chamber 30, and probing assembly 100, or at least a portion of probing assembly 100. In addition, shielding structure 200 is adapted, configured, designed, shaped, sized, and/or constructed to restrict, limit, block, and/or occlude fluid flow through aperture 34. Shielding structure 200 also is adapted, configured, designed, shaped, sized, and/or constructed to shield enclosed volume 32 from an ambient environment 18 that surrounds measurement chamber 30, that is external to measurement chamber 30, and/or that is external to enclosed volume 32. As examples, shielding structure 200 may shield the enclosed volume from electromagnetic radiation that may be present within the ambient environment, from electric fields that may be present within the ambient environment, from magnetic fields that may be present within the ambient environment, from thermal gradients that may be present within the external environment, and/or from visible light that may be present within the ambient environment.

As illustrated in dashed lines in FIG. 1, probe system 20 further may include a chuck 50 having a support surface 52 that is configured to support substrate 40 and/or DUT 42. Chuck 50 and/or support surface 52 thereof may be located and/or may extend within enclosed volume 32. As also illustrated in dashed lines in FIG. 1, probe system 20 may include a chuck actuator 60. Chuck actuator 60 may be configured to operatively translate chuck 50 relative to probe 110 and/or to operatively rotate chuck 50 relative to probe 110, such as to facilitate alignment between one or more DUTs 42 and probe 110.

FIG. 1 further illustrates that probe system 20 may include a plurality of apertures 34, a corresponding plurality of probing assemblies 100, and a corresponding plurality of shielding structures 200. Each of the plurality of probing assemblies 100 may be associated with a respective one of the plurality of apertures and also with a respective one of the plurality of shielding structures.

During operation of probe systems 20 according to the present disclosure, manipulator 130 may be utilized to operatively translate probe arm 120 throughout a probe arm range-of-motion, thereby operatively translating probe 110 relative to DUT 42. As an example, one or more manipulators 130 may be utilized to operatively align one or more corresponding probes 110 with specific, target, and/or desired locations on DUT 42, such as to permit communication between the one or more probes and the DUT. This may include operative translation of probe arm 120, and thus probe 110, in a plurality of different, separate, distinct, perpendicular, and/or orthogonal directions, such as the X, Y, and Z-directions that are illustrated in FIGS. 1-7. In the example of FIGS. 1-7, the X and Y-directions may be parallel, or at least substantially parallel, to an upper surface 44 of substrate 40, while the Z-direction may be perpendicular, or at least substantially perpendicular, to upper surface 44. However, this specific configuration is not required.

During this operative translation of probe arm 120, manipulator 130, at least a portion of manipulator 130, and/or a least a portion of manipulator 130 that is operatively attached to probe arm 120 and/or to DUT-distal end 122 thereof may move and/or translate with probe arm 120. Stated another way, at least a portion of manipulator 130 may move and/or translate relative to measurement chamber 30 and/or relative to aperture 34 when the manipulator moves the probe arm throughout the probe arm range-of-motion.

As illustrated in FIGS. 2-5 and discussed in more detail herein, shielding structure 200 is configured to maintain at least a threshold separation distance 210 from probe arm 120 when the probe arm is moved throughout the probe arm range-of-motion and/or regardless of a position of probe arm 120 within the probe arm range-of-motion. Stated another way, shielding structure 200 is configured to permit probe arm 120 to be operatively translated, via manipulator 130 and/or throughout the probe arm range-of motion, without physical contact between the shielding structure and the probe arm and/or without direct physical contact between the shielding structure and the probe arm. Stated yet another way, shielding structure 200 may be configured to permit probe arm 120 to be operatively translated, via manipulator 130 and/or throughout the probe arm range-of-motion, without frictional resistance, or direct frictional resistance, to motion of the probe arm by the shielding structure and/or without applying a torque, or directly applying a torque, to the probe arm with, or by, the shielding structure.

Such a configuration, in which shielding structure 200 shields enclosed volume 32 but dues not contact probe arm 120, may permit more accurate and/or precise positioning of probe 110 relative to DUT 42 when compared to more conventional and/or traditional probe systems that do not include shielding structures 200 according to the present disclosure. As an example, shielding structure 200 may permit motion of probe arm 120 without stick-slip motion of the probe arm that might be caused by resistance to motion of the probe arm, by the shielding structure, were the shielding structure to contact the probe arm.

As discussed, shielding structure 200 is configured to restrict fluid flow through aperture 34. Such a configuration may permit one or more environmental conditions within enclosed volume 32 to be maintained differently from corresponding environmental conditions within ambient environment 18 that surrounds probe system 20. Examples of the one or more environmental conditions include one or more of a humidity within the enclosed volume, a temperature within the enclosed volume, and/or a gas composition within the enclosed volume.

Shielding structure 200 may restrict the fluid flow in any suitable manner. As an example, the shielding structure may be configured to restrict, limit, block, and/or occlude fluid flow into enclosed volume 32 via aperture 34. As another example, shielding structure 200 may be configured to restrict, limit, block, and/or occlude diffusion of moisture into the enclosed volume via the aperture.

As a more specific example, shielding structure 200 may provide, or present, a tortuous flow path for fluid flow into the enclosed volume via the aperture. As yet another more specific example, aperture 34 may have an aperture area and shielding structure 200 may have an open area for fluid flow therethrough, such as may be defined by a plurality of pores and/or holes, which may extend through the shielding structure. Under these conditions, the open area of the shielding structure may be less than 20%, less than 15%, less than 10%, less than 5%, less than 3%, less than 2%, less than 1%, and/or less than 0.5% of the aperture area.

Shielding structure 200 additionally or alternatively may be adapted, configured, designed, sized, and/or constructed to restrict, limit, block, and/or occlude transmission of ambient light into enclosed volume 32 via aperture 34. As examples, shielding structure 200 may be configured to attenuate the ambient light that passes from ambient environment 18 into enclosed volume 32 via aperture 34 by at least 100 decibels (dB), by at least 110 dB, by at least 120 dB, by at least 130 dB, and/or by at least 140 dB. This attenuation of ambient light also may be referred to herein as shielding the enclosed volume from ambient, or visible, light that may be present within the ambient environment.

Stated another way, shielding structure 200 may include and/or may be formed from a light-absorbing material that absorbs light that may be incident thereon and that thereby restricts, limits, blocks, and/or occludes transmission of ambient light into enclosed volume 32 via aperture 34. Additionally or alternatively, shielding structure 200 may include and/or be formed from a light-reflecting material that reflects light that may be incident thereon and that thereby restricts, limits, blocks, and/or occludes transmission of ambient light into enclosed volume 32 via aperture 34.

Shielding structure 200 additionally or alternatively may be adapted, configured, designed, sized, and/or constructed to restrict, limit, block, and/or occlude transmission of electromagnetic radiation into enclosed volume 32 via aperture 34. As examples, shielding structure 200 may be configured to attenuate the electromagnetic radiation that passes from ambient environment 18 into enclosed volume 32 via aperture 34 by at least 10 dB, by at least 12.5 dB, by at least 15 dB, by at least 17.5 dB, and/or by at least 20 dB. This attenuation also may be referred to herein as shielding the enclosed volume from electromagnetic radiation that may be present within ambient environment 18.

Stated another way, shielding structure 200 may include and/or may be formed from an electromagnetic radiation-absorbing material that absorbs electromagnetic radiation that may be incident thereon and that thereby restricts, limits, blocks, and/or occludes transmission of electromagnetic radiation into enclosed volume 32 via aperture 34. Additionally or alternatively, shielding structure 200 may include and/or be formed from an electromagnetic radiation-reflecting material that reflects electromagnetic radiation that may be incident thereon and that thereby restricts, limits, blocks, and/or occludes transmission of electromagnetic radiation into enclosed volume 32 via aperture 34.

It is within the scope of the present disclosure that shielding structure 200 may be configured to attenuate the electromagnetic radiation within a specified frequency range. The specified frequency range may be bounded by a minimum frequency and a maximum frequency. Examples of the minimum frequency include minimum frequencies of 0 Hertz (Hz), at least 0 Hz, at least 10 Hz, at least 100 Hz, at least 1 kilohertz (kHz), at least 10 kHz, and/or at least 100 kHz. Examples of the maximum frequency include maximum frequencies of 5 gigahertz (GHz), at most 5 GHz, at most 1 GHz, at most 100 megahertz (MHz), at most 10 MHz, or at most 1 MHz.

Shielding structure 200 may be formed from and/or may include any suitable material and/or materials. In general, and as discussed, at least a portion of probing assembly 100, such as probe 110, probe arm 120, and/or manipulator 130, may move relative to aperture 34 when the probe arm is moved throughout the probe arm range-of-motion. As such, shielding structure 200 and/or a material thereof, may be adapted, configured, designed, sized, and/or selected to permit this relative motion and/or to permit this relative motion without damage to the shielding structure. Thus, and as examples, the shielding structure may be formed from one or more of a flexible material, an elastomeric material, and/or a resilient material. Examples of such materials include a rubber, a cloth, and/or a metal. More specific examples of shielding structure 200 include a thin metal sheet, a fabric, and/or a gasket.

As discussed, shielding structure 200 may be configured to maintain at least the threshold separation distance, such as threshold separation distance 210 that is illustrated in FIGS. 2-5, from probe arm 120 when the probe arm is moved throughout the probe arm range-of-motion. Examples of the threshold separation distance include threshold separation distances of at least 1 millimeter (mm), at least 2 mm, at least 4 mm, at least 6 mm, at least 8 mm, and/or at least 10 mm. The threshold separation distance additionally or alternatively may be at most 30 mm, at most 25 mm, at most 20 mm, at most 18 mm, at most 16 mm, at most 14 mm, at most 12 mm, and/or at most 10 mm.

The threshold separation distance in a given direction (such as the X, Y, and/or Z-directions of FIGS. 1-7) also may be described as being at least a threshold multiple of a maximum extent of the probe arm range-of-motion in the given direction. Examples of the threshold multiple include threshold multiples of at least 0.5, at least 1, at least 1.5, at least 2, and/or at least 2.5. The threshold multiple additionally or alternatively may be at most 10, at most 8, at most 6, at most 4, and/or at most 2.

Shielding structure 200 may have and/or define any suitable shape and/or may extend between any suitable portion of measurement chamber 30 and any suitable portion of probing assembly 100 other than probe arm 120. As an example, and as illustrated schematically in FIG. 1 and less schematically in FIGS. 2-5, shielding structure 200 may extend between, may be operatively attached to, may be in contact with, and/or may be in direct physical contact with measurement chamber 30 and manipulator 130. Stated another way, shielding structure 200 may extend between manipulator 130 and aperture 34. Stated yet another way, shielding structure 200 may be in contact, or in direct physical contact, with measurement chamber 30 and/or with manipulator 130.

Under these conditions, and as illustrated in FIG. 1, probe system 20 further may include a chamber-side mounting structure 202 that operatively attaches the shielding structure to the measurement chamber. Additionally or alternatively, probe system 20 also may include a manipulator-side mounting structure 204 that operatively attaches the shielding structure to the manipulator. Since manipulator-side mounting structure 204 is operatively attached to manipulator 130, the manipulator-side mounting structure may operatively translate with the manipulator during translation of the probe arm via the manipulator. Stated another way, a portion of the shielding structure that is operatively attached to the manipulator by the manipulator-side mounting structure may operatively translate, with the manipulator, during operative translation of the probe arm.

When shielding structure 200 extends between and/or is operatively attached to measurement chamber 30 and manipulator 130, probe arm 120 may extend through aperture 34. In addition, shielding structure 200 may define a shielded volume 220 that may include, contain, and/or house at least a portion of the probe arm. Stated another way, shielding structure 200 may extend around, or surround, at least the portion of probe arm 120.

Figure 4:
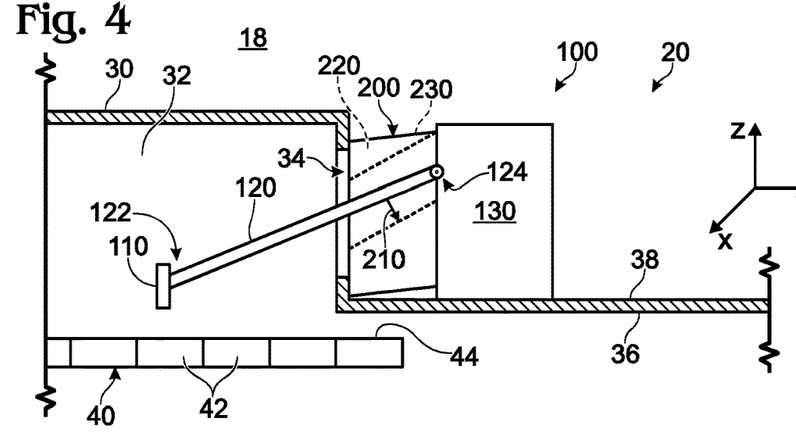
FIG. 4 is a less schematic cross-sectional view of the probe system of FIGS. 2-3 illustrating a third relative alignment between a probe and a DUT.
Figure 5:
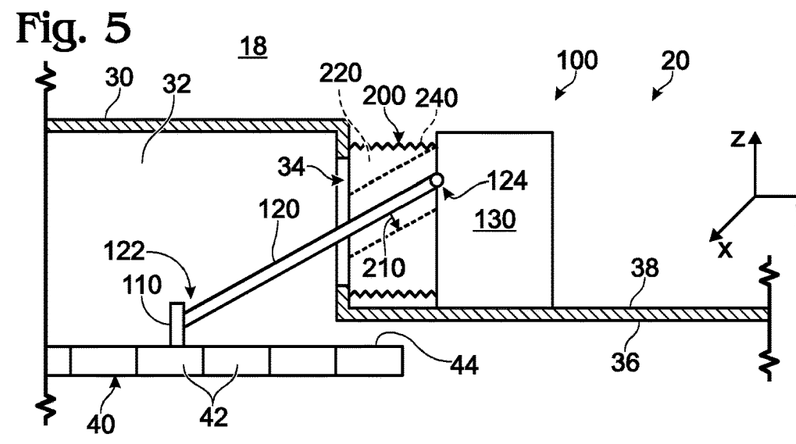
FIG. 5 is a less schematic cross-sectional view of a portion of another shielded probe system according to the present disclosure.

An example of a shielding structure that extends between manipulator 130 and measurement chamber 30 includes a bellows, or a metallic bellows, 240, as illustrated in FIGS. 1 and 5. Another example of a shielding structure that extends between manipulator 130 and measurement chamber 30 includes a tube, which may include and/or be a fabric tube, 230, as illustrated in FIGS. 1-4.

When shielding structure 200 includes tube 230, the tube may include and/or may be formed from a plurality of layers. In addition, at least one of the layers may include a different composition, or material of construction, than at least one other of the layers. As an example, at least one of the layers may include and/or be formed from an electrically conductive material and/or fabric, which may be configured to restrict transmission of electromagnetic radiation therepast and/or thereacross. As another example, at least one of the layers may include and/or be formed from a sealing material and/or fabric that is configured to restrict fluid flow thereacross. As yet another example, at least one of the plurality of layers may include and/or be formed from an opaque material and/or fabric, which may be configured to restrict transmission of light thereacross.

Figure 6:
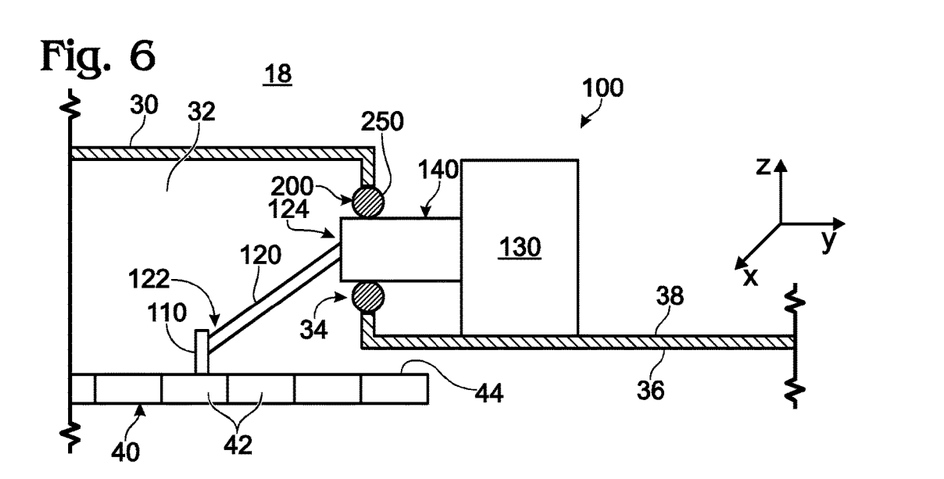
FIG. 6 is a less schematic cross-sectional view of a portion of another shielded probe system according to the present disclosure.
Figure 7:
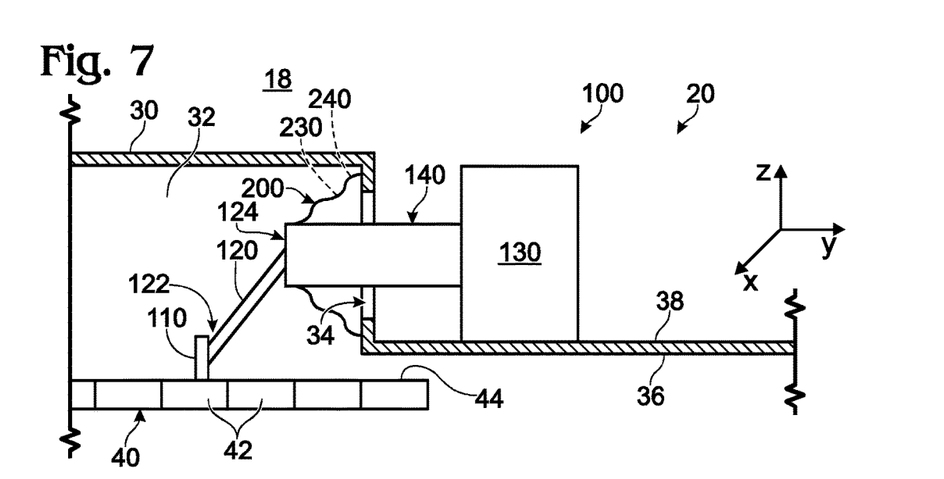
FIG. 7 is a less schematic cross-sectional view of a portion of another shielded probe system according to the present disclosure.

As illustrated schematically in FIG. 1 and less schematically in FIGS. 6-7, probing assembly 100 may include a probe arm mount 140. Probe arm mount 140 may extend from manipulator 130 and may operatively attach the probe arm to the manipulator. When probing assembly 100 includes probe arm mount 140, the probe arm mount may extend through aperture 34.

In general, and as illustrated, probe arm mount 140 may be thicker and/or more substantial than probe arm 120. As an example, probe arm mount 140 may include and/or define a greater transverse cross-sectional area than a transverse cross-sectional area of probe arm 120. As more specific examples, the transverse cross-sectional area of probe arm mount 140 may be at least 2, at least 4, at least 6, at least 8, at least 10, at least 15, or at least 20 times greater than the transverse cross-sectional area of probe arm 120.

As another example, probe arm mount 140 may be more rigid than probe arm 120. As more specific examples, a stiffness of the probe arm mount may be at least 2, at least 4, at least 6, at least 8, at least 10, at least 15, at least 20, at least 30, at least 40, and/or at least 50 times larger than a stiffness of the probe arm. As used herein, the term stiffness is defined as a force applied to a body divided by a deflection of the body that is produced by the applied force.

As discussed, probe arm mount 140 may extend within and/or through aperture 34. Thus, the transverse cross-sectional area of the probe arm mount may be less than the cross-sectional area of the aperture. As examples, the transverse cross-sectional area of the probe arm mount may be less than 90%, less than 80%, less than 70%, less than 60%, and/or less than 50% of the cross-sectional area of the aperture. Additionally or alternatively, the transverse cross-sectional area of the probe arm mount may be at least 20%, at least 30%, at least 40%, at least 50%, at least 60%, at least 70%, and/or at least 80% of the cross-sectional area of the aperture.

When probing assembly 100 includes probe arm mount 140, and as illustrated in FIGS. 6-7, shielding structure 200 may extend between measurement chamber 30 and probe arm mount 140. In addition, shielding structure 200 may be operatively attached to measurement chamber 30 and/or to probe arm mount 140. Additionally or alternatively, shielding structure 200 may be in contact, or direct physical contact, with measurement chamber 30 and/or with probe arm mount 140.

An example of shielding structures 200 that extend between measurement chamber 30 and probe arm mount 140 include a polymeric gasket 250, as illustrated in FIG. 6. Additional examples of shielding structures 200 that extend between measurement chamber 30 and probe arm mount 140 include a tube 230 and/or a bellows 240, as illustrated in FIG. 7.

Measurement chamber 30 may include and/or be any suitable structure that may define enclosed volume 32 and/or that may house and/or contain at least a portion of probing assembly 100, substrate 40, and/or DUT 42. In addition, measurement chamber 30 also may be configured to shield and/or protect at least the portion of probing assembly 100, substrate 40, and/or DUT 42 from the ambient environment that surrounds probe system 20. As examples, measurement chamber 30 may include and/or be a sealed, fluidly sealed, and/or hermetically sealed measurement chamber. As additional examples, measurement chamber 30 may be configured to restrict transmission of ambient light and/or other electromagnetic radiation into the enclosed volume. As yet another example, measurement chamber 30 may be configured to provide shielding for DUT 42 and probe 110 from electromagnetic radiation. As another example, measurement chamber 30 may include one or more walls 39, which may at least partially bound enclosed volume 32 and/or aperture 34.

Measurement chamber 30 may include and/or be formed from any suitable material and/or materials. As examples, measurement chamber 30 may include and/or be an electrically conductive measurement chamber, a metallic measurement chamber, and/or an electrically shielded measurement chamber.

Aperture 34 may be defined and/or formed within wall 39 of measurement chamber 30. In addition, aperture 34 may open into enclosed volume 32 and/or may extend between an internal surface 36 and an external surface 38 of measurement chamber 30. Furthermore, aperture 34 may be sized to permit motion of probe arm 120 throughout the probe arm range-of-motion without contact, without physical contact, and/or without direct physical contact between the measurement chamber and the portion of the probing assembly that extends through the aperture. Stated another way, the transverse cross-sectional area of the probe arm mount may be less than the cross-sectional area of the aperture, as discussed herein.

Probe 110 may include any suitable structure that may be adapted, configured, designed, and/or constructed to be oriented within enclosed volume 32, to be operatively attached to probe arm 120, to receive test signal 72 from signal generation and analysis assembly 70, to provide test signal 72 to DUT 42, to receive resultant signal 74 from DUT 42, and/or to provide resultant signal 74 to signal generation and analysis assembly 70. Stated another way, probe 110 may include any suitable structure that may be configured to be oriented relative to DUT 42 to selectively provide communication between the probe and the DUT and/or to be between probe system 20 and the DUT. To provide this selective communication, probe 110 may be configured to contact DUT 42, to directly contact DUT 42, to electrically contact DUT 42, to selectively be placed into and/or out of electrical communication with DUT 42, to optically contact DUT 42, to be selectively placed into and/or out of optical contact with DUT 42, to electromagnetically contact DUT 42, and/or to be selectively placed into and/or out of electromagnetic communication with DUT 42. Examples of probe 110 include a needle probe, a probe card, a probe tile, an optical probe, and/or an electromagnetic probe.

Probe arm 120 may include and/or be any suitable structure that may include and/or define DUT-distal end 122 and DUT-proximal end 124, that may be operatively attached to probe 110, and/or that may be operatively attached to manipulator 130 directly and/or via probe arm mount 140.

As an example, probe arm 120 may include and/or be an elongate probe arm, which may extend between the DUT-distal end and the DUT-proximal end thereof. When probe arm 120 is the elongate probe arm, a length of the elongate probe arm may be at least a threshold multiple of the maximum extent of the probe arm range-of-motion. As examples, the length of the elongate probe arm may be at least 2 times, at least 4 times, at least 6 times, at least 8 times, at least 10 times, at least 15 times, or at least 20 times greater than the maximum extent of the probe arm range-of-motion.

In addition, a maximum transverse cross-sectional dimension of the elongate probe arm may be less than a threshold multiple of the maximum extent of the probe arm range-of-motion. As examples, the maximum transverse cross-sectional dimension of the elongate probe arm may be at most 5 times, at most 4 times, at most 3 times, at most 2 times, at most 1.5 times, at most 1 times, at most 0.8 times, at most 0.6 times, or at most 0.4 times the maximum extent of the probe arm range-of-motion. Additionally or alternatively, the maximum transverse cross-sectional dimension of the elongate probe arm may be at least 2 mm, at least 3 mm, at least 4 mm, at least 5 mm, at least 6 mm, at least 7 mm, at least 8 mm, at least 9 mm, at least 10 mm, at most 20 mm, at most 18 mm, at most 16 mm, at most 15 mm, at most 14 mm, at most 13 mm, at most 12 mm, at most 11 mm, and/or at most 10 mm.

Manipulator 130 may include and/or be any suitable structure that may be operatively attached to DUT-distal end 122 of probe arm 120 and/or that may be configured to operatively translate probe arm 120 throughout the probe arm range-of-motion. As discussed, manipulator 130 may be external to enclosed volume 32 and/or may be operatively attached to external surface 38 of measurement chamber 30. As also discussed, the probe arm range-of-motion may extend in three orthogonal, or at least substantially orthogonal, axes, such as the X, Y, and Z-axes of FIGS. 1-7.

The probe arm range-of-motion may have and/or define the maximum extent in each direction in which the manipulator is configured to operatively translate the probe arm, such as along the three orthogonal axes and/or along the X, Y, and Z-axes. This maximum extent may be the same along each axis or may differ for two or more axes. Examples of the maximum extent of the probe arm range-of-motion in one or more directions include maximum extents of at least 1 millimeter (mm), at least 2 mm, at least 4 mm, at least 6 mm, at least 8 mm, at least 10 mm, at least 12 mm, at least 15 mm, or at least 20 mm. Additionally or alternatively, the maximum extent of the probe arm range-of-motion in one or more directions may be at most 50 mm, at most 40 mm, at most 30 mm, at most 25 mm, at most 20 mm, at most 18 mm, at most 16 mm, at most 14 mm, at most 12 mm, and/or at most 10 mm.

Manipulator 130 may include any suitable structure. As examples, manipulator 130 may include one or more translation stages, lead screws, ball screws, rack and pinion assemblies, motors, stepper motors, electrical actuators, mechanical actuators, micrometers, and/or manual actuators. Manipulator 130 may be a manually actuated manipulator and/or an automated, or electrically actuated, manipulator.

As illustrated in dashed lines in FIG. 1, probe system 20 may include one or more signal conduits 80, which may extend between manipulator 130 and probe 110 and/or between signal generation and analysis assembly 70 and probe 110. Signal conduits 80 may include and/or be shielded signal conduits 80 that include a shield conductor. Under these conditions, the shield conductor may be electrically connected, or electrically grounded, to and/or with manipulator 130 and/or measurement chamber 30.

Substrate 40 may include and/or be any suitable structure that may support, include, and/or have formed thereon DUT 42. Examples of substrate 40 include a wafer, a semiconductor wafer, a silicon wafer, and/or a gallium arsenide wafer.

Similarly, DUT 42 may include and/or be any suitable structure that may be probed and/or tested by probe system 20. As examples, DUT 42 may include a semiconductor device, an electronic device, an optical device, a logic device, a power device, a switching device, and/or a transistor.

Figure 2:
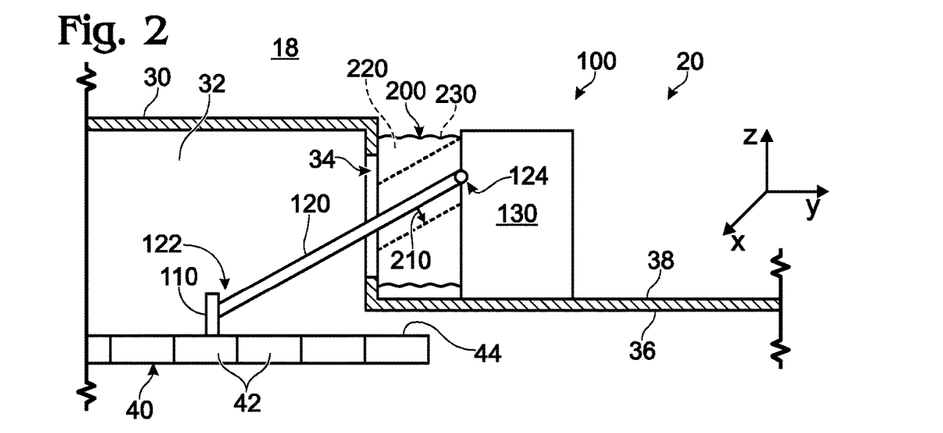
FIG. 2 is a less schematic cross-sectional view of a portion of a shielded probe system, according to the present disclosure, illustrating a first relative alignment between a probe and a DUT.
Figure 3:
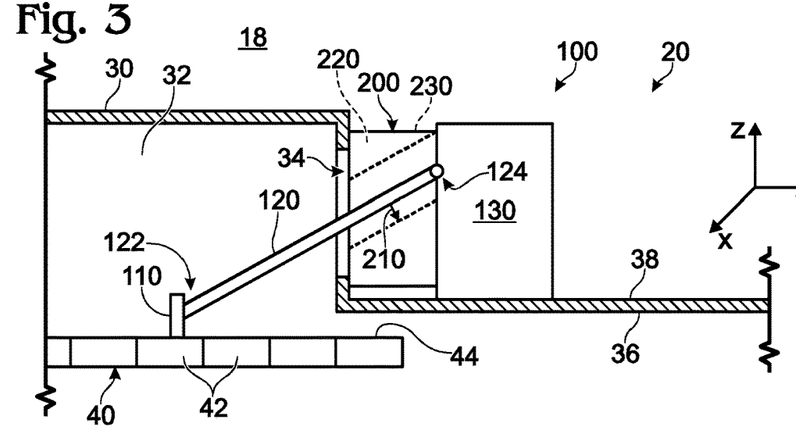
FIG. 3 is a less schematic cross-sectional view of the probe system of FIG. 2 illustrating a second relative alignment between a probe and a DUT.

Turning now to FIGS. 2-4, examples of the probe arm range-of-motion of probe arm 120 are illustrated. As discussed herein, and although not required, the probe arm range-of-motion may extend along three different, perpendicular, and/or orthogonal axes, such as the X, Y, and Z-axes, and manipulator 130 may be configured to operatively translate probe arm 120, and thus probe 110, throughout the probe arm range-of-motion.

As an example, FIG. 2 may illustrate a maximum extent to which manipulator 130 may translate probe arm 120 in a negative Y-direction, while FIG. 3 may illustrate a maximum extent to which manipulator 130 may translate probe arm 120 in a positive Y-direction. Under these conditions, a difference between a location of probe 110 along the Y-axis in FIG. 3 and a location of probe 110 along the Y-axis in FIG. 2 may correspond to a maximum extent of the probe arm range-of-motion in the Y-direction. Similarly, FIG. 2 may illustrate a maximum extent to which manipulator 130 may translate probe arm 120 in a negative Z-direction, while FIG. 4 may illustrate a maximum extent to which manipulator 130 may translate probe arm 120 in a positive Z-direction. Under these conditions, a difference between a location of probe 110 along the Z-axis in FIG. 4 and a location of probe 110 along the Z-axis in FIG. 2 may correspond to a maximum extent of the probe arm range-of-motion in the Z-direction. A similar analysis applies equally to motion of probe arm 120, or probe 110, via manipulator 130 and along the X-axis.

FIGS. 2-4 also illustrate that, as discussed herein, shielding structure 200 maintains at least threshold separation distance 210 from probe at 120 throughout the probe arm range-of-motion. As such, shielding structure 200 does not contact, does not apply a torque to, and/or does not apply a frictional force to probe arm 120 when the probe arm is moved throughout the probe arm range-of-motion.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

Examples of systems according to the present disclosure are presented in the following enumerated paragraphs.

A1. A shielded probe system for testing a device under test (DUT), the probe system comprising:

a measurement chamber at least partially bounding an enclosed volume configured to receive the DUT;

an aperture defined by the measurement chamber and providing access into the enclosed volume from external the measurement chamber;

a probing assembly, including:
(i) a probe oriented within the enclosed volume;
(ii) a probe arm including a DUT-distal end and a DUT-proximal end, wherein the DUT-proximal end of the probe arm is operatively attached to the probe; and
(iii) a manipulator that is operatively attached to the DUT-distal end of the probe arm, wherein the manipulator is external to the enclosed volume, wherein the manipulator is configured to operatively translate the probe arm throughout a probe arm range-of-motion to operatively translate the probe relative to the DUT, and further wherein at least a portion of the probing assembly extends through the aperture; and a shielding structure extending between the measurement chamber and the probing assembly, wherein the shielding structure is configured to:

(i) restrict fluid flow through the aperture;
(ii) shield the enclosed volume from an ambient environment that surrounds the measurement chamber; and
(ii) maintain at least a threshold separation distance between the shielding structure and the probe arm when the probe arm is moved throughout the probe arm range-of-motion.

A2. The probe system of paragraph A1, wherein the shielding structure restricts, optionally blocks, fluid flow into the enclosed volume via the aperture.

A3. The probe system of any of paragraphs A1-A2, wherein the shielding structure is configured to restrict, optionally restricts, and further optionally blocks, diffusion of moisture into the enclosed volume via the aperture.

A4. The probe system of any of paragraphs A1-A3, wherein the aperture has an aperture area, wherein the shielding structure has an open area for fluid flow therethrough, and further wherein the open area of the shielding structure is less than 20%, less than 15%, less than 10%, less than 5%, less than 3%, less than 2%, less than 1%, or less than 0.5% of the aperture area.

A5. The probe system of any of paragraphs A1-A4, wherein the shielding structure provides a tortuous flow path for fluid flow into the enclosed volume via the aperture.

A6. The probe system of any of paragraphs A1-A5, wherein the shielding structure is configured to restrict transmission of ambient light into the enclosed volume via the aperture, and optionally to attenuate the ambient light by at least 100 decibels (dB), by at least 110 dB, by at least 120 dB, by at least 130 dB, or by at least 140 dB.

A7. The probe system of any of paragraphs A1-A6, wherein the shielding structure is configured to restrict transmission of electromagnetic radiation into the enclosed volume via the aperture, and optionally to attenuate the electromagnetic radiation by at least 10 decibels (dB), by at least 12.5 dB, by at least 15 dB, by at least 17.5 dB, or by at least 20 dB.

A8. The probe system of any of paragraphs A1-A7, wherein the shielding structure is configured to restrict transmission of electromagnetic radiation with a specified frequency range into the enclosed volume via the aperture, optionally wherein the specified frequency range is bounded by a minimum frequency and a maximum frequency, and further optionally wherein:
(i) the minimum frequency is one of 0 Hertz (Hz), at least 0 Hz, at least 10 Hz, at least 100 Hz, at least 1 kilohertz (kHz), at least 10 kHz, or at least 100 kHz; and
(ii) the maximum frequency is one of 5 gigahertz (GHz), at most 5 GHz, at most 1 GHz, at most 100 megahertz (MHz), at most 10 MHz, or at most 1 MHz.

A9. The probe system of any of paragraphs A1-A8, wherein the shielding structure is formed from at least one of:
(i) a flexible material;
(ii) an elastomeric material; and
(iii) a resilient material.

A10. The probe system of any of paragraphs A1-A9, wherein the shielding structure is formed from at least one of:
(i) a rubber;
(ii) a cloth; and
(iii) a metal.

A11. The probe system of any of paragraphs A1-A10, wherein the shielding structure includes at least one of:
(i) a bellows;
(ii) a fabric; and
(iii) a gasket.

A12. The probe system of any of paragraphs A1-A11, wherein the shielding structure includes, and optionally is, a bellows, or a metallic bellows, that extends between the manipulator and the measurement chamber.

A13. The probe system of any of paragraphs A1-A12, wherein the shielding structure includes, and optionally is, a tube, or a fabric tube, that extends between the manipulator and the measurement chamber.

A14. The probe system of paragraph A13, wherein the tube includes a plurality of layers.

A15. The probe system of paragraph A14, wherein at least one layer of the plurality of layers includes a different composition than at least one other layer of the plurality of layers.

A16. The probe system of any of paragraphs A14-A15, wherein at least one layer of the plurality of layers includes an electrically conductive fabric configured to restrict transmission of electromagnetic radiation thereacross.

A17. The probe system of any of paragraphs A14-A16, wherein at least one layer of the plurality of layers includes a sealing fabric configured to restrict fluid flow thereacross.

A18. The probe system of any of paragraphs A14-A17, wherein at least one layer of the plurality of layers includes opaque fabric configured to restrict transmission of light thereacross.

A19. The probe system of any of paragraphs A1-A18, wherein the shielding structure includes, and optionally is, a polymeric gasket that extends between and contacts the measurement chamber and the probing assembly.

A20. The probe system of any of paragraphs A1-A19, wherein the threshold separation distance is at least one of:
(i) at least 1 millimeter (mm), at least 2 mm, at least 4 mm, at least 6 mm, at least 8 mm, or at least 10 mm; and
(ii) at most 30 mm, at most 25 mm, at most 20 mm, at most 18 mm, at most 16 mm, at most 14 mm, at most 12 mm, or at most 10 mm.

A21. The probe system of any of paragraphs A1-A20, wherein the threshold separation distance in a given direction is at least a threshold multiple of a/the maximum extent of the probe arm range-of-motion in the given direction, optionally wherein the threshold multiple is at least one of:
(i) at least 0.5, at least 1, at least 1.5, at least 2, or at least 2.5; and
(ii) at most 10, at most 8, at most 6, at most 4, or at most 2.

A22. The probe system of any of paragraphs A1-A21, wherein the shielding structure is operatively attached to the measurement chamber and to the manipulator.

A23. The probe system of any of paragraphs A1-A22, wherein the probe arm extends through the aperture, and further wherein the shielding structure defines a shielded volume that contains at least a portion of the probe arm.

A24. The probe system of paragraph A23, wherein the shielded volume extends between the manipulator and the aperture.

A25. The probe system of any of paragraphs A1-A24, wherein the shielding structure extends around, or surrounds, at least a portion of the probe arm.

A26. The probe system of any of paragraphs A1-A25, wherein the shielding structure is a tubular shielding structure.

A27. The probe system of any of paragraphs A1-A26, wherein the shielding structure is in contact, and optionally in direct physical contact, with the measurement chamber.

A28. The probe system of any of paragraphs A1-A27, wherein the shielding structure is in contact, and optionally in direct physical contact, with the manipulator.

A29. The probe system of any of paragraphs A1-A28, wherein the probing assembly further includes a probe arm mount that extends from the manipulator and operatively attaches the probe arm to the manipulator, and further wherein the probe arm mount extends through the aperture.

A30. The probe system of paragraph A29, wherein the shielding structure is in contact, and optionally in direct physical contact, with the probe arm mount.

A31. The probe system of any of paragraphs A29-A30, wherein the shielding structure extends between the probe arm mount and the measurement chamber.

A32. The probe system of any of paragraphs A1-A31, wherein the shielding structure is configured to permit the probe arm to be operatively translated, via the manipulator, throughout the probe arm range-of-motion without at least one of:
 (i) physical contact between the shielding structure and the probe arm;
 (ii) direct physical contact between the shielding structure and the probe arm;
 (iii) stick-slip motion of the probe arm caused by resistance to motion of the probe arm by the shielding structure;
 (iv) frictional resistance to motion of the probe arm by the shielding structure;
 (v) direct frictional resistance to motion of the probe arm by the shielding structure;
 (vi) applying torque to the probe arm; and
 (vii) directly applying torque to the probe arm.

A33. The probe system of any of paragraphs A1-A32, wherein the measurement chamber is a sealed, optionally a fluidly sealed, and further optionally a hermetically sealed, measurement chamber.

A34. The probe system of any of paragraphs A1-A33, wherein the measurement chamber is configured to restrict transmission of ambient light into the enclosed volume.

A35. The probe system of any of paragraphs A1-A34, wherein the measurement chamber is configured to restrict transmission of electromagnetic radiation into the enclosed volume.

A36. The probe system of any of paragraphs A1-A35, wherein the measurement chamber is configured to provide shielding for the DUT and the probe from electromagnetic interference.

A37. The probe system of any of paragraphs A1-A36, wherein the measurement chamber is at least one of an electrically conductive measurement chamber, a metallic measurement chamber, and an electrically shielded measurement chamber.

A38. The probe system of any of paragraphs A1-A37, wherein the aperture is sized to permit motion of the probe arm throughout the probe arm range-of-motion without physical contact, or direct physical contact, between the measurement chamber and the portion of the probing assembly that extends through the aperture.

A39. The probe system of any of paragraphs A1-A38, wherein the probe is configured to at least one of provide a test signal to the DUT and receive a resultant signal from the DUT.

A40. The probe system of any of paragraphs A1-A39, wherein the probe includes at least one of a needle probe, a probe card, a probe tile, an optical probe, and an electromagnetic probe.

A41. The probe system of any of paragraphs A1-A40, wherein the probe is configured to at least one of:
 (i) provide electrical communication between the probe system and the DUT;
 (ii) provide optical communication between the probe system and the DUT; and
 (iii) provide electromagnetic communication between the probe system and the DUT.

A42. The probe system of any of paragraphs A1-A41, wherein the probe arm extends through the aperture.

A43. The probe system of any of paragraphs A1-A42, wherein the probe arm is an elongate probe arm.

A44. The probe system of any of paragraphs A1-A43, wherein a length of the probe arm is at least a threshold multiple of a maximum extent of the probe arm range-of-motion, wherein the threshold multiple is at least 2 times, at least 4 times, at least 6 times, at least 8 times, at least 10 times, at least 15 times, or at least 20 times.

A45. The probe system of any of paragraphs A1-A44, wherein the manipulator is operatively attached to an external surface of the measurement chamber.

A46. The probe system of any of paragraphs A1-A45, wherein the probe arm range-of-motion extends in three orthogonal, or at least substantially orthogonal, axes.

A47. The probe system of paragraph A46, wherein the probe arm range-of-motion defines a maximum extent in each of the orthogonal, or at least substantially orthogonal, axes, optionally wherein the maximum extent is at least one of:
 (i) at least 1 millimeter (mm), at least 2 mm, at least 4 mm, at least 6 mm, at least 8 mm, at least 10 mm, at least 12 mm, at least 15 mm, or at least 20 mm; and
 (ii) at most 50 mm, at most 40 mm, at most 30 mm, at most 25 mm, at most 20 mm, at most 18 mm, at most 16 mm, at most 14 mm, at most 12 mm, or at most 10 mm.

A48. The probe system of any of paragraphs A1-A47, wherein at least a portion of the manipulator translates with the probe arm when the probe arm is moved throughout the probe arm range-of-motion.

A49. The probe system of any of paragraphs A1-A48, wherein the manipulator is a manually actuated manipulator.

A50. The probe system of any of paragraphs A1-A49, wherein the probing assembly further includes a signal conduit extending between the manipulator and the probe.

A51. The probe system of paragraph A50, wherein the signal conduit is a shielded signal conduit including a shield.

A52. The probe system of paragraph A51, wherein the shield conductor is electrically connected to at least one of the manipulator and the measurement chamber.

A53. The probe system of any of paragraphs A1-A52, wherein the probe system further includes a chamber-side mounting structure that operatively attaches the shielding structure to the measurement chamber.

A54. The probe system of any of paragraphs A1-A53, wherein the probe system further includes a manipulator-side mounting structure that operatively attaches the shielding structure to the manipulator.

A55. The probe system of paragraph A54, wherein the manipulator-side mounting structure operatively translates, with the manipulator, during operative translation of the probe arm via the manipulator.

A56. The probe system of any of paragraphs A54-A55, wherein a portion of the shielding structure that is operatively attached to the manipulator by the manipulator-side mounting structure operatively translates, with the manipulator, during operative translation of the probe arm via the manipulator.

A57. The probe system of any of paragraphs A1-A56, wherein the probe system further includes a chuck including a support surface configured to support a substrate that includes the DUT, wherein the chuck is located within the enclosed volume.

A58. The probe system of paragraph A57, wherein the probe system further includes a chuck actuator configured to at least one of operatively translate the chuck relative to the probe and operatively rotate the chuck relative to the probe.

A59. The probe system of any of paragraphs A1-A58, wherein the probe system further includes a signal generation and analysis assembly configured to provide a/the test signal to the DUT and to receive a/the resultant signal from the DUT.

A60. The probe system of any of paragraphs A1-A59, wherein the measurement chamber defines a plurality of apertures, wherein the probe system includes a plurality of probing assemblies, wherein each of the plurality of probing assemblies is associated with a respective one of the plurality of apertures, and further wherein the probing assembly includes a plurality of shielding structures, wherein each of the shielding structures is associated with a respective one of the plurality of probing assemblies.

INDUSTRIAL APPLICABILITY

The systems and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A shielded probe system for testing a device under test (DUT), the probe system comprising:
   a measurement chamber at least partially bounding an enclosed volume configured to receive the DUT;
   an aperture defined by the measurement chamber and providing access into the enclosed volume from external the measurement chamber;
   a probing assembly, including:
   (i) a probe oriented within the enclosed volume;
   (ii) a probe arm including a DUT-distal end and a DUT-proximal end, wherein the DUT-proximal end of the probe arm is operatively attached to the probe; and
   (iii) a manipulator that is operatively attached to the DUT-distal end of the probe arm, wherein the manipulator is external to the enclosed volume, wherein the manipulator is configured to operatively translate the probe arm throughout a probe arm range-of-motion to operatively translate the probe relative to the DUT, wherein the probe arm range-of-motion extends in three at least substantially orthogonal axes, wherein at least a portion of the probing assembly extends through the aperture, and further wherein the aperture is sized to permit motion of the probe arm throughout the probe arm range-of-motion without physical contact between the measurement chamber and the portion of the probing assembly that extends through the aperture; and
   a shielding structure extending between, and contacting, the measurement chamber and the manipulator, wherein the shielding structure is configured to:
   (i) restrict fluid flow through the aperture;
   (ii) shield the enclosed volume from an ambient environment that surrounds the measurement chamber; and
   (iii) maintain at least a threshold separation distance between the shielding structure and the probe arm when the probe arm is moved throughout the probe arm range-of-motion.

2. The probe system of claim 1, wherein the shielding structure provides a tortuous flow path for fluid flow into the enclosed volume via the aperture.

3. The probe system of claim 1, wherein the shielding structure is configured to restrict transmission of ambient light into the enclosed volume via the aperture by attenuating the ambient light by at least 100 decibels.

4. The probe system of claim 1, wherein the shielding structure is configured to restrict transmission of electromagnetic radiation into the enclosed volume via the aperture by attenuating the electromagnetic radiation by at least 10 decibels.

5. The probe system of claim 1, wherein the shielding structure is formed from a flexible material.

6. The probe system of claim 1, wherein the shielding structure includes a metallic bellows that extends between, and contacts, the manipulator and the measurement chamber.

7. The probe system of claim 1, wherein the shielding structure includes a fabric tube that extends between, and contacts, the manipulator and the measurement chamber.

8. The probe system of claim 1, wherein the shielding structure includes a polymeric gasket that extends between and contacts the measurement chamber and the probing assembly.

9. The probe system of claim 1, wherein the probe arm extends through the aperture, and further wherein the shielding structure defines a shielded volume that contains at least a portion of the probe arm and extends between the manipulator and the aperture.

10. The probe system of claim 1, wherein the shielding structure is configured to permit the probe arm to be operatively translated, via the manipulator, throughout the probe arm range-of-motion without direct physical contact between the shielding structure and the probe arm.

11. The probe system of claim 1, wherein the probe is configured to at least one of provide a test signal to the DUT and receive a resultant signal from the DUT.

12. The probe system of claim 1, wherein the probe includes at least one of a needle probe, a probe card, a probe tile, an optical probe, and an electromagnetic probe.

13. The probe system of claim 1, wherein the manipulator is operatively attached to an external surface of the measurement chamber.

14. The probe system of claim 1, wherein the probe arm range-of-motion defines a maximum extent in each of the at least substantially orthogonal axes, and further wherein the maximum extent is at least 1 millimeter and at most 20 millimeters.

15. The probe system of claim 1, wherein at least a portion of the manipulator translates with the probe arm when the probe arm is moved throughout the probe arm range-of-motion.

16. The probe system of claim 15, wherein a portion of the shielding structure is operatively attached to the manipulator and operatively translates, with the manipulator, during operative translation of the probe arm via the manipulator.

17. The probe system of claim 1, wherein the probe system further includes a chuck including a support surface configured to support a substrate that includes the DUT, wherein the chuck is located within the enclosed volume, and further wherein the probe system includes a chuck actuator configured to at least one of operatively translate the chuck relative to the probe and operatively rotate the chuck relative to the probe.

18. The probe system of claim 1, wherein the probe system further includes a signal generation and analysis assembly configured to provide a test signal to the DUT and to receive a resultant signal from the DUT.

19. The shielded probe system of claim 1, wherein the shielding structure is external to the enclosed volume of the measurement chamber.

20. The probe system of claim 1, wherein the probe arm extends through the aperture, wherein the shielding structure defines a shielded volume, wherein at least a portion of the probe arm extends within the shielded volume, and further wherein the shielded volume extends entirely between the manipulator and the aperture.

21. The probe system of claim 1, wherein the manipulator is configured to operatively translate the portion of the probing assembly that extends through the aperture throughout the probe arm range-of-motion.

22. The probe system of claim 1, wherein the shielding structure does not contact a portion of the probing assembly that extends within the enclosed volume.

* * * * *